(12) United States Patent
Obata et al.

(10) Patent No.: US 7,910,190 B2
(45) Date of Patent: Mar. 22, 2011

(54) THIN FILM FOR REFLECTION FILM OR FOR SEMI-TRANSPARENT REFLECTION FILM, SPUTTERING TARGET AND OPTICAL RECORDING MEDIUM

(75) Inventors: Tomokazu Obata, Isehara (JP); Hiroshi Yanagihara, Isehara (JP)

(73) Assignee: Tanaka Kinkinzoku Kogyo K.K., Tokyo (JP)

( * ) Notice: Subject to any disclaimer, the term of this patent is extended or adjusted under 35 U.S.C. 154(b) by 628 days.

(21) Appl. No.: 11/915,400

(22) PCT Filed: Nov. 17, 2006

(86) PCT No.: PCT/JP2006/322931
§ 371 (c)(1),
(2), (4) Date: Nov. 26, 2007

(87) PCT Pub. No.: WO2008/059580
PCT Pub. Date: May 22, 2008

(65) Prior Publication Data
US 2010/0040898 A1    Feb. 18, 2010

(51) Int. Cl.
*B32B 3/02* (2006.01)
(52) U.S. Cl. .............. 428/64.1; 428/64.4; 428/64.5; 430/270.11; 430/270.13
(58) Field of Classification Search .................. None
See application file for complete search history.

(56) References Cited

U.S. PATENT DOCUMENTS
| | | |
|---|---|---|
| 6,596,366 B2 | 7/2003 | Ohno ............................ 428/64.1 |
| 2004/0005432 A1 | 1/2004 | Ridout et al. ................. 428/64.4 |
| 2005/0255281 A1 | 11/2005 | Shinotsuka et al. .......... 428/64.4 |

FOREIGN PATENT DOCUMENTS
| | | |
|---|---|---|
| EP | 1178476 | 2/2002 |
| JP | 06-243509 | 9/1994 |
| JP | 7-3440 A | 1/1995 |
| JP | 08-260135 | 10/1996 |
| JP | 10-177742 | 6/1998 |
| JP | 10177742 | * 6/1998 |
| JP | 11-134715 | 5/1999 |
| JP | 2000-109943 | 4/2000 |
| JP | 2002-117582 | 4/2002 |
| JP | 2003-06926 | 1/2003 |
| JP | 2004-076068 | 3/2004 |
| JP | 2005-293646 | 10/2005 |

* cited by examiner

*Primary Examiner* — Elizabeth Mulvaney
(74) *Attorney, Agent, or Firm* — Roberts & Roberts, LLP

(57) ABSTRACT

A thin film for a reflection film or a semi-transparent reflection film, which has a compound phase comprising at least one selected from the group consisting of a nitride, an oxide, a complex oxide, a nitroxide, a carbide, a sulfide, a chloride, a silicide, a fluoride, a boride, a hydride, a phosphide, a selenide and a telluride of gallium, palladium or copper, dispersed in a matrix formed of silver or a silver alloy. The compound phase in the thin film may include at least one compound selected from the group consisting of nitride, oxide, complex oxide, nitroxide, carbide, sulfide, chloride, silicide, fluoride, boride, hydride, phosphide, selenide and telluride of silver. The thin film of the present invention minimizes the deterioration of the reflectance even after a long period of use, and can prolong the life of various devices which use the thin film as a reflection film, such as an optical recording medium and a display. The thin film can be also applied to a semi-reflective/semi-transparent film used in the optical recording medium.

18 Claims, 2 Drawing Sheets

Material structure (b)

THIN FILM FOR REFLECTION FILM OR FOR SEMI-TRANSPARENT REFLECTION FILM, SPUTTERING TARGET AND OPTICAL RECORDING MEDIUM

TECHNICAL FIELD

The present invention relates to a thin film useful as a reflection film or a semitransparent reflection film used in an optical recording medium, a display and the like. The present invention particularly relates to the thin film which shows reflectance that does not decrease even after having been used for a long period of time, and the optical recording medium having the thin film as the reflection film or the semi-transparent reflection film.

BACKGROUND ART

Figure 1:
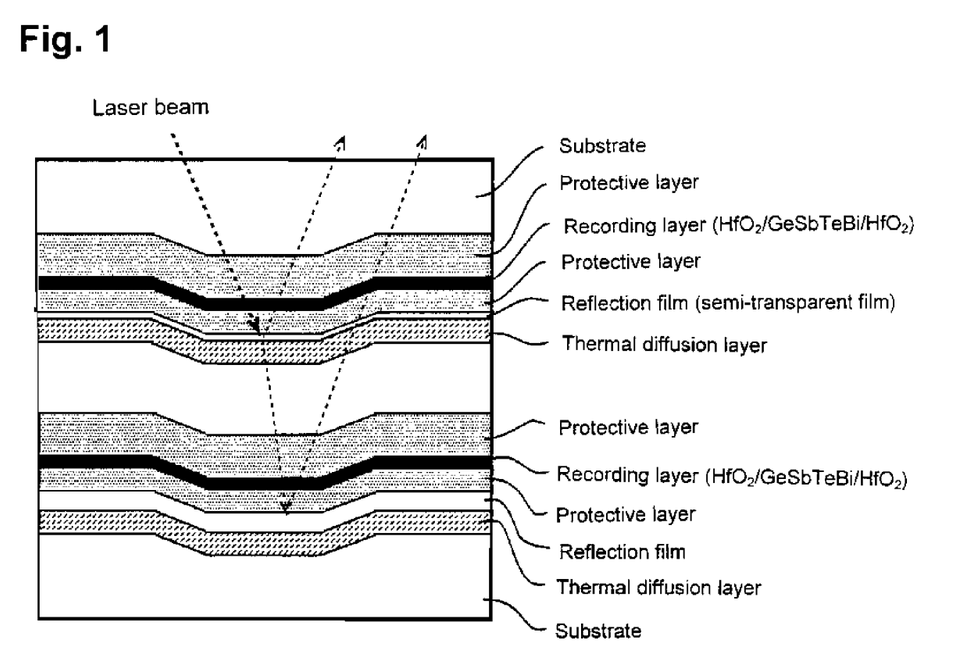
FIG. 1 illustrates an example of a structure for an HD-DVD.

An optical recording medium, such as a CD-R/RW, a DVD-R/RW/RAM and a Blue-Ray disk, and a display device, such as a liquid crystal display and an organic luminescent display have at least one layer of a reflection film formed therein. For instance, FIG. 1 shows a structure of an HD-DVD (one-sided, dual-layer rewritable disk) which has been developed in recent years, as an example of the optical recording medium. As shown in the example, the optical recording medium has a multilayer structure comprising the reflection film in addition to a recording layer which plays a predominant role of the function of the optical recording medium, a protective layer and a thermal diffusion layer.

Many conventional reflection films are made from silver. This is because silver has a high reflectance and is more inexpensive than gold having the high reflectance similarly to silver. Silver also has excellent optical transparency when the film thickness is appropriately adjusted, accordingly can be possibly used as a semi-transparent reflection film, and from this fact, has been applied to an optical recording medium being developed now (cf. FIG. 1).

On the other hand, silver has a problem of changing the color to black through being corroded to decrease its reflectance, because of being inferior in corrosion resistance. The factor of causing corrosion in a reflection film is, for instance, an organic dye applied in a recording layer of an optical recording medium, though it varies depending on an applied medium and device. Then, the reflection film shows lower reflectance after having been corroded by the organic dye for a long period of use. In addition, the reflection film in a display device may cause corrosion due to the atmospheric moisture. For this reason, a thin film made from a silver alloy has been developed which contains various elements in a silver matrix, so as to solve the problem of the corrosion resistance of silver.

For instance, Patent Document 1 discloses a silver alloy containing 0.5 to 10 atom % ruthenium and 0.1 to 10 atom % aluminum, and Patent Document 2 discloses a silver alloy containing 0.5 to 4.9 atom % palladium. In addition, Patent Document 3 and Patent Document 4 disclose a silver alloy containing Ca, V and Nb, and the like.

Patent Document 1: Japanese Patent Application Laid-Open No. 134715/1999

Patent Document 2: Japanese Patent Application Laid-Open No. 2000-109943

Patent Document 3: Japanese Patent Application Laid-Open No. 243509/1994

Patent Document 4: Japanese Patent Application Laid-Open No. 2003-6926

DISCLOSURE OF THE INVENTION

Problems to be Solved by the Invention

A thin film composed of the above described silver alloy shows a certain effect of having improved corrosion resistance. Then, a problem of the corrosion should have been solved, but an optical recording medium using a thin film formed from the silver alloy still can not completely inhibit a recording error caused by the degradation of the reflection film. On the other hand, a material more excellent in reflectance-keeping characteristics than ever has been required along with requirement to a further improvement of a recording speed and recording density toward future.

On the basis of the background, the present invention is directed at providing a thin film that is applied to a reflection film and a semi-transparent reflection film, which compose an optical recording medium, a display and the like, and that can function without decreasing its reflectance even after a long period of use; and a production method therefor.

Means for Solving the Problems

In order to solve such a problem, the present inventors made an extensive research on a mechanism how a silver thin film degrades its reflecting characteristics, and found that the factor of the degradation is not only in simple corrosion (blackening) but also in a phenomenon that silver atoms migrate while the thin film is heated. The phenomenon of the migration of the silver atoms is a phenomenon that silver atoms composing a flat thin film right after having been formed migrate toward an energetically stable state through being driven by a given environmental condition. At this time, the silver atoms migrate not only in a planar direction but also in a three-dimensional direction in many cases, and as a result, cohere into a polygonal shape close to a sphere. When such a three-dimensionally cohered body is formed in the thin film, a laser beam incident on the thin film is reflected toward irregular directions with respect to an incident axis and consequently toward many directions. Accordingly, an optical recording medium employing such a thin film for a reflection film reflects less light toward a sensor of an optical recording device in a sensor axis direction, and consequently causes an error in the recording medium.

The above described phenomenon of the migration and cohesion of silver atoms differs from a corrosion phenomenon. In this regard, it is considered that a conventional silver alloy is not ineffective in inhibiting a migration phenomenon of silver atoms. This is because a metal atom alloyed with silver should be more or less active in inhibiting the migration of silver atoms. However, it is assumed that the conventional silver alloy mainly has aimed at improving corrosion resistance, and accordingly all the alloyed components have not been effective for inhibiting the migration of the silver atoms.

Then, the present inventors studied a technique for inhibiting silver atoms from migrating in a thin film; examined silver alloys having the effect; found that it is effective as a further improved remedy for inhibiting the silver atoms from migrating to disperse a silver compound phase in silver or a silver alloy, and thus formed thin film acquires superior reflectance-keeping characteristics; and arrived at the present invention.

Specifically, the present invention provides a thin film for a reflection film or a semi-transparent reflection film, which includes a compound phase comprising at least one of nitride, oxide, complex oxide, nitroxide, carbide, sulfide, chloride, silicide, fluoride, boride, hydride, phosphide, selenide and telluride of gallium, palladium or copper, dispersed in a matrix formed of silver or a silver alloy.

In the present invention, by dispersing the phase consisting of the above described three compounds in a matrix formed of silver or a silver alloy, it becomes possible to inhibit the migration of silver atoms composing the matrix, to maintain the flatness of a thin film, and thereby to inhibit the reflectance from lowering even when the thin film has received heat.

Specific examples of a compound phase are shown in Table 1. These compounds include a compound in a nonstoichiometric state, in addition to compounds having a composition in a stoichiometric state as shown in Table 1, which makes the compounds stably exist; and accordingly, for instance, GaN (gallium nitride) includes $Ga_xN_{1-x}$ (0<x<1).

TABLE 1

| | Ga | Cu | Pd |
|---|---|---|---|
| Nitride | GaN ($Ga_{1-x}N_x$) | $Cu_3N$ ($Cu_{3-z}N_z$) | PdN ($Pd_{1-x}N_x$) |
| Oxide | $Ga_2O_3$ ($Ga_{1.5-a}O_a$) | $Cu_2O$ ($Cu_{2-y}O_y$) | PdO ($Pd_{1-x}O_x$) |
| Carbide | GaC ($Ga_{1-x}C_x$) | CuC ($Cu_{1-x}C_x$) | PdC ($Pd_{1-x}C_x$) |
| Sulfide | GaS ($Ga_{1-x}S_x$) | CuS ($Cu_{1-x}S_x$) | PdS ($Pd_{1-x}S_x$) |
| Fluoride | GaF ($Ga_{1-x}F_x$) | $CuF_2$ ($Cu_yO_{2-y}$) | PdF ($Pd_{1-x}F_x$) |
| Boride | GaB ($Ga_{1-x}B_x$) | CuB ($Cu_{1-x}B_x$) | PdB ($Pd_{1-x}B_x$) |
| Silicide | GaSi ($Ga_{1-x}Si_x$) | $Cu_5Si$ ($Cu_{5-b}O_b$) | PdSi ($Pd_{1-x}Si_x$) |
| Chloride | $GaCl_3$ ($Ga_xCl_{3-x}$) | CaCl ($Cu_{1-x}Cl_x$) | $PdCl_2$ ($Pd_yB_{2-y}$) |
| Phosphide | GaP ($Ga_{1-x}P_x$) | CuP ($Cu_{1-x}P_x$) | PdP ($Pd_{1-x}P_x$) |
| Selenide | GaSe ($Ga_{1-x}Se_x$) | CuSe ($Cu_{1-x}Se_x$) | PdSe ($Pd_{1-x}Se_x$) |
| Telluride | GaTe ($Ga_{1-x}Te_x$) | CuTe ($Cu_{1-x}Te_x$) | PdTe ($Pd_{1-x}Te_x$) |
| Complex oxide | $CuGaS_2$, $AgGaS_2$ $CuGaSe_2$, $AgGaSe_2$ $CuGaTe_2$, $AgGaTe_2$ | $CuFe_2O_4$, $CuMoO_4$ $CuTiO_3$, $CuCr_2O_4$ $CuWO_4$, $CuSeO_4$ | |

$0 < x < 1, 0 < y < 2, 0 < z < 3$
$0 < a < 1.5, 0 < b < 5$

Furthermore, a thin film according to the present invention may include any of silver compounds among nitride, oxide, complex oxide, nitroxide, carbide, sulfide, chloride, suicide, fluoride, boride, hydride, phosphide, selenide and telluride of silver, as a compound phase. Specific examples of the silver compound are shown in Table 2. The silver compounds include not only intentionally formed compounds but also the compounds which are concurrently produced when the above described compound phase of gallium or the like is formed, as will be described later in a section on a method for producing the thin film. The compound phase formed of the silver compound also acts to inhibit silver atoms in the thin film from migrating, similarly as the compound phase of gallium or the like does. In addition, these silver compound phases include a compound in a nonstoichiometric state as well.

TABLE 2

| | |
|---|---|
| Nitride | AgN ($Ag_{1-x}N_x$) |
| Oxide | $Ag_2O$, AgO ($Ag_{1-x}O_x$) |
| Carbide | AgC ($Ag_{1-x}C_x$) |
| Sulfide | $Ag_2S$ ($Ag_{2-x}S_x$) |
| Fluoride | AgF ($Ag_{1-x}F_x$) |
| Boride | AgB ($Ag_{1-x}B_x$) |
| Silicide | AgSi ($Ag_{1-x}Si_x$) |
| Chloride | AgCl ($Ag_{1-x}Cl_x$) |
| Phosphide | AgP ($Ag_{1-x}P_x$) |
| Selenide | $Ag_2Se$ ($Ag_{2-y}Se_y$) |
| Telluride | $Ag_2Te$ ($Ag_{2-x}Te_x$) |

TABLE 2-continued

| | |
|---|---|
| Complex oxide | $Ag_2MO_4Ag_2WO_4$ $AgVO_3Ag_2CrO_4$ $Ag_4P_2O_7Ag_3PO_4$ |

$0 < x < 1, 0 < y < 2$

These compound phases are preferably contained in an amount of 0.001 to 2.5 wt. %. The compound phase in an amount of 0.001 wt. % or more is necessary for sufficiently inhibiting the migration of silver atoms. In addition, the upper limit is set at 2.5 wt. % because the silver compound contained above the upper limit imparts an insufficient initial reflectance to the thin film. Accordingly, the content of the silver compound phase is preferably 0.001 to 1.0 wt. %, and further preferably is 0.001 to 0.5 wt. %. As the content of the compound phase increases, the effect of inhibiting the lowering of the reflectance increases but the reflectance tends to decrease. It is preferable to control the content of the compound phase according to an application field within the above described range. In the above description, the content of the compound phase is based on the total weight of the thin film (the total weight of the matrix and the compound phase). In addition, when the silver compound phase exists in the film, the content is a sum of the content of the silver compound and the contents of the compounds of gallium, palladium and copper. Furthermore, even when only the compounds of gallium, palladium and copper exist in the film as the compound phase, the content is preferably in the above described range.

A compound phase is preferably dispersed in a particulate form composed of many molecules of the compound, but is not always limited to this form. Specifically, the compound phase may be formed of molecules of at least one compound. The size of the compound phase is preferably controlled into 1/10 or less of a thickness of a thin film. For instance, when the thickness of the thin film is set at 1000 Å, the compound phase preferably has a size of 100 Å or smaller, and when the thickness of the thin film is set at 120 Å, the dispersing compound phase preferably has a size of 12 Å or smaller.

On the other hand, the matrix of a thin film according to the present invention is formed from pure silver or a silver alloy.

In the present invention, an effect of inhibiting the migration of silver atoms is mainly taken by a compound phase, but alloyed components also possess the effect to be reckoned with. On the other hand, even though pure silver is employed as the matrix, the thin film acquires excellent reflectance-keeping characteristics due to the action of the compound phase. For this reason, in the present invention, any of pure silver and a silver alloy shall be used as the matrix.

When a silver alloy is employed as a matrix, the alloy is preferably an alloy formed from silver and at least any one element of gallium, palladium and copper. These elements are metallic elements composing the compound phase shown at the beginning of the above description, but also form alloy components by being alloyed with silver to inhibit the migration phenomenon of silver atoms.

When a silver alloy is employed as a matrix, the concentration of a metal to be alloyed with silver is preferably 0.01 to 10 wt. %. This is because when the concentration is less than 0.01 wt. %, the alloying makes no sense, and when the concentration exceeds 10 wt. %, the thin film aggravates its reflectance. Furthermore, the concentration is more preferably 0.01 to 5 wt. %, and further preferably is 0.01 to 3.5 wt. %. The above described concentration of the metal is based on a weight of the silver alloy of the matrix.

In the next place, a method for producing a thin film according to the present invention will be described. A reflection film according to the present invention has preferably a thickness of 120 to 1200 Å when applied to an optical recording medium, a display and the like. When producing a thin film with such a film thickness, it is preferably to apply a sputtering technique as a production method. When applying the sputtering technique for producing the thin film containing a compound phase, the technique includes two directions which will be described below.

A first technique is a method of using a target having a structure and a composition similar to a thin film to be produced, specifically, is a method of using a sputtering target prepared by dispersing a compound phase comprising at least one of nitride, oxide, complex oxide, nitroxide, carbide, sulfide, chloride, silicide, fluoride, boride, hydride, phosphide, selenide and telluride of gallium, palladium or copper, in a matrix formed of silver or a silver alloy. The method can produce the thin film with the use of one sheet of target, accordingly can produce the thin film by a sputtering technique with a form of arranging the target so as to face a substrate, which is ordinarily employed when producing a reflection film, and consequently produce the thin film with adequate productivity. Here, there are further three forms in the sputtering target for producing the thin film according to the present invention, as will be described below.

A first form is an internally chemically-combined type target. The internally chemically-combined type target is prepared by heat-treating a raw material composed of silver (pure silver) or a silver alloy in an atmosphere of high-pressure oxygen gas, nitrogen gas or the like to chemically combine silver or a metal to be alloyed with silver in the interior partially with oxygen or nitrogen or the like into the oxide, the nitride or the like. The raw material described in the above may have a tabular shape close to the shape of the target, or may be prepared by employing a granular material, chemically combining the interior with other elements for the raw material, and then compression-molding the resultant granular material.

A second form to be used is a sintered target. The sintered target is prepared by mixing a powder of silver (pure silver) or a silver alloy with a powder made from a compound to be dispersed in the target in accordance with a composition to be aimed, pressing the mixed powder, and sintering the compact. The sintered target is useful for producing a thin film which is difficult to produce from the above described internally chemically-combined type target due to, for example, a limited content of the compound phase, and is preferable for producing a thin film, for instance, in which copper oxide, gallium oxide or copper nitride is dispersed as a compound phase.

Figure 2:
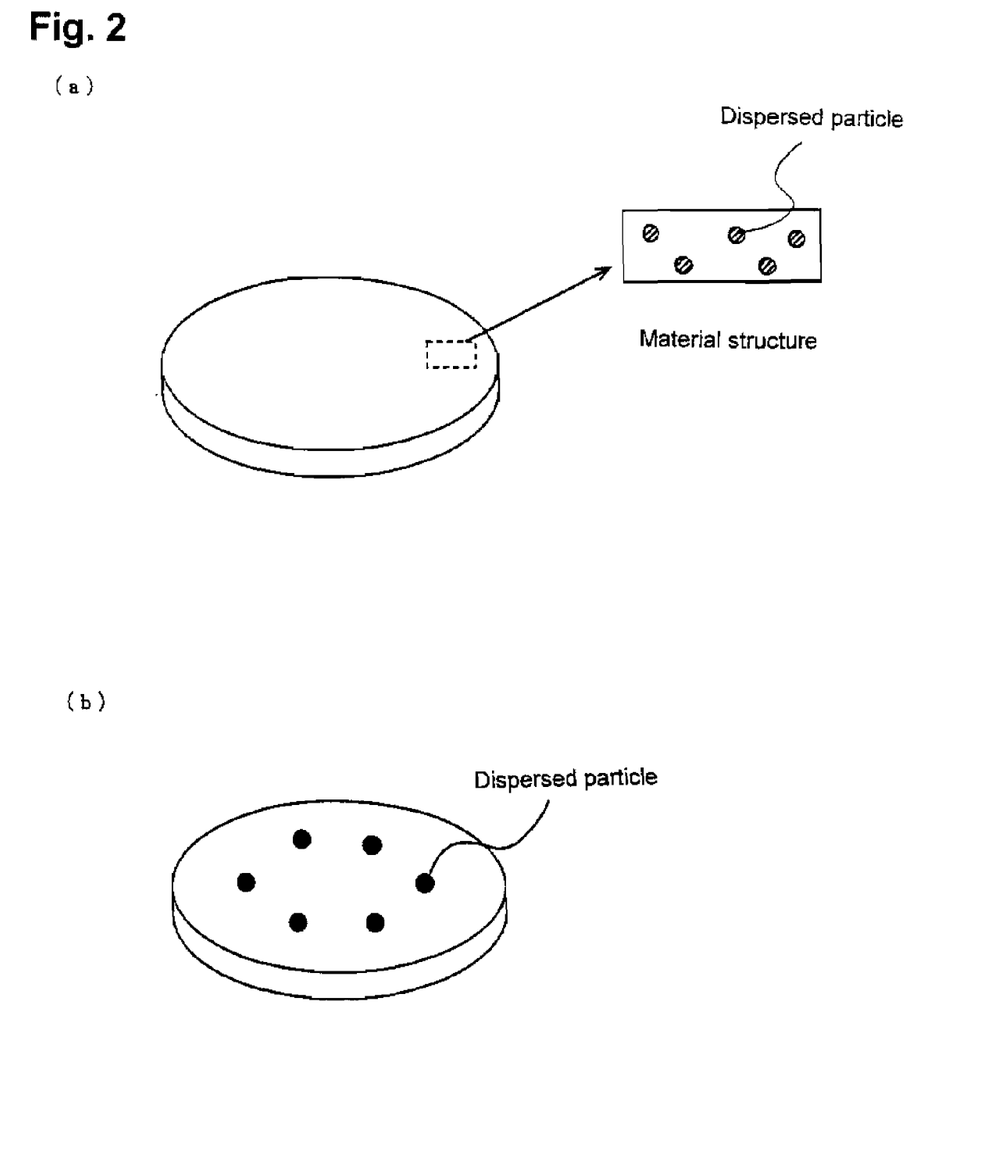
FIG. 2 illustrates specific examples of a sputtering target for producing a reflection film or a semi-transparent reflection film according to the present invention.

A third form is an embedded type target. The embedded type target is prepared by preparing a target made from pure silver or a silver alloy, and embedding a small piece (with a cylindrical shape and a spherical shape though the shape is not limited) containing a compound which is to be dispersed, into a region to be consumed by the sputtering. The above described internally chemically-combined type target and sintered target have a composition and a structure microscopically close to those of a thin film to be produced, as is shown in FIG. 2(a), whereas this target has those macroscopically close to the thin film to be produced, as is shown in FIG. 2(b). When the target is used, the composition of the thin film to be produced can be controlled by changing a diameter of the small piece of the compound to be embedded, positions of the small pieces to be arranged, the number of the pieces and a sputtering rate.

In the above described three types of targets, a content of a compound phase is preferably controlled so as to have the same composition as a thin film to be produced. Accordingly, the content of the compound is preferably 0.001 to 2.5 wt. %, more preferably is 0.001 to 1.0 wt. %, and further preferably is 0.001 to 0.5 wt. %. In addition, the size of the compound phase in these targets is not limited in particular, and may be the same molecular level as in the case of the thin film to be produced, or may be a millimeter order as in the case of the embedded type target. This is because whatever the size of the compound phase, a compound is sputtered in a molecule unit when being sputtered, and the formed thin film acquires the composition to be aimed.

In addition, because it is preferable that this target has the same composition as a thin film to be produced, a silver alloy to be a matrix is preferably an alloy formed from silver and at least any one element of gallium, palladium and copper. The concentration of an alloying metal such as gallium is preferably 0.01 to 10 wt. %, more preferably is 0.01 to 5 wt. %, and further preferably is 0.01 to 3.5 wt. %.

A second direction for producing a thin film according to the present invention is to improve a sputtering method. The method employs mainly a general target of pure silver or a silver alloy as a target, and does not employ a special target as is used in the above described first direction. In the second direction, there are further two applicable techniques which will be now described below.

A first technique is a co-sputtering technique with the use of a plurality of targets. The technique is a method of simultaneously sputtering a plurality of targets made from a chemical compound having the same composition as a phase composing a thin film, and made from the same metal. For instance, the thin film having a compound phase formed of gallium oxide ($Ga_2O_3$) dispersed in silver or a silver alloy can be produced by using two targets of a pure silver target or a silver alloy target, and a gallium oxide ($Ga_2O_3$) target, placing them together in a chamber, and simultaneously sputtering the two targets. The method is useful when it is difficult to prepare a special target such as an internally chemically-combined type target as was described above.

In addition, it is particularly useful in this second direction for improving a sputtering condition to employ a reactive sputtering technique. The reactive sputtering is a technique of adding a reactive gas such as oxygen and nitrogen into an atmosphere for sputtering, sputtering the target, and forming a thin film while oxidizing or nitriding all or one part of a particle sputtered from a target. The reactive sputtering technique is a useful method when a compound to be dispersed in the thin film is expensive, is not available or is difficult to be chemically prepared.

The reactive sputtering technique may be singularly used, but may be used in combination with another technique. For instance, when using the above described special integral target, specifically, using an internally chemically-combined target, a sintered target and an embedded type target, and when it is anticipated that a content of a compound in a thin film will be insufficient only by singly using the targets, it is possible to increase the content of a compound in the thin film by introducing a reactive gas into an atmosphere in a sputtering apparatus. In addition, when producing a thin film by using a co-sputtering technique as well, it is possible to adjust the amount of the compound by using the reactive sputtering technique in combination with the co-sputtering technique.

BEST MODE FOR CARRYING OUT THE INVENTION

In the present embodiment, at first, three targets were produced which were an internally chemically-combined type target, a sintered type target and an embedded type target. Then, a thin film was produced not only by using these targets, but also by using a co-sputtering technique and a reactive sputtering technique. Incidentally, when compositions of a target and a thin film are expressed hereafter, they are expressed in the form of matrix/compound phase, and in the form, a front part of "/" represents a matrix and a rear part represents a compound phase. When a silver alloy is used as the matrix, the concentration of an alloying element is expressed by weight % contained in the silver alloy of the matrix. For instance, Ag-10.0 wt. % Ga/1.0 wt. % $Cu_3N$ of a sample No. 10 means that the thin film (target) has 1.0 wt. % $Cu_3N$ dispersed in a matrix of a silver alloy having a composition of Ag-10.0 wt. % Ga, with respect to a total weight of the thin film (target).

A: Production of Sputtering Target (a) Internally Chemically-Combined Type Target An internally chemically-combined type target was prepared by the steps of: preparing 5.0 kg of a granular raw material of an Ag-2.0 wt. % Ga alloy with a particle diameter of 1.0 to 3.0 mm; charging it into a high-pressure reactive pot; replacing the air inside the pot sufficiently with nitrogen gas; increasing a pressure and a temperature respectively to a nitrogen gas pressure of 0.8 MPa and 800° C.; and keeping the pot in the state for 48 hours for subjecting Ga to internal nitriding; then, slowly cooling the internally nitrided silver grains; taking them out; charging them into a die; high-pressure-extruding them at 750° C. into an integral compact; forging the compact; rolling the forged compact into a plate (with size of 160 mm×160 mm×6 mm); and the cutting the plate into a sputtering target having a standard size (with a diameter of 152 mm (6 inches) and a thickness of 5 mm). The target had a composition of Ag/2.5 wt. % GaN, which includes 2.5 wt. % gallium nitride as a compound phase and silver as a matrix. The composition corresponds to a sample No. 1 which will be described later.

In addition to the above described target, an Ag/1.0 wt. % Cu3N (sample No. 2) target was prepared as an internally chemically-combined type target. The target of the sample No. 2 was produced by using an Ag-0.93 wt. % Cu alloy as a raw material, and nitriding the interior with a nitrogen gas pressure of 0.5 MPa and at 750° C. for a holding period of 24 hours.

(b) Sintered Type Target

A sintered type target was produced by the steps of: preparing a powder of an Ag-10.0 wt. % Ga alloy and a powder of copper nitride both with particle sizes of 50 to 100 μm; weighing the powders so as to form an aimed composition; sufficiently mixing them; then charging the mixture into a die made from carbon; pressing the mixture to form a green compact; then sintering the green compact in a vacuum sintering furnace at 750° C. for 8 hours to form a sintered compact; forging and rolling the compact into a plate for further improving a densed degree; and then cutting the plate into a sputtering target with the same standard size as described previously. The target had a composition of Ag/10 wt. % Ga/1.0 wt. % $Cu_3N$. The target corresponds to the sample No. 10 which will be described later.

In addition to the above target, targets corresponding to samples No. 3 to 9, 11 and 12 were prepared as a sintered type target, by changing the types of a silver alloy powder and a compound powder.

(c) Embedded Type Target

An embedded type target was produced by the steps of: preparing a disc with a standard size (with a diameter of 152 mm (6 inches) and a thickness of 5 mm) made from an Ag-3.0 wt. % Ga-0.5 wt % Cu alloy; perforating three round holes with a diameter of 1.05 mm at regular spaces so as to form a circle with a diameter of 80 mm; inserting round bars made from gallium oxide ($Ga_2O_3$) with a diameter of 1.0 mm and a length of 5 mm into the round holes; and calking perimeters of the round bars so that the round bars might not drop off and could be fixed. The target had a composition of Ag-3.0 wt. % Ga-0.5 Cu wt. %/1.0 wt. % $Ga_2O_3$. The target corresponds to the sample No. 3 which will be described later.

In addition to the above targets, targets corresponding to samples No. 14 to 19 were prepared as an embedded type target, by changing an alloy composition of a disc and a composition and the number of round bars to be embedded.

B: Production of Thin Film

A thin film was produced by using the above described various targets, and by employing a co-sputtering technique and a reactive sputtering technique. Here, the thin film was formed on a polycarbonate substrate for DVD. The substrate (with a diameter of 120 mm and a sheet thickness of 0.6 mm) was produced through an injection molding machine provided with a stamper, in which a pre-format pattern was formed. On the top face of the substrate, the reflection film was formed into a film thickness of 120 Å with each method.

(i) A thin film was formed on a polycarbonate substrate by using each of three targets produced in the above described items (a) to (c). Setting each target in a sputtering chamber; and evacuating the chamber; introducing Ar gas till the pressure reaches $5.0\times10^{-1}$ Pa; placing a substrate right under the target in a resting state; and sputtering the target at a direct current of 0.4 kW for eight seconds. Then, the thickness of the resulting film was distributed within ±10%.

(ii) Co-sputtering

Three plates of a silver alloy target with a composition of Ag-1.0 wt. % Pd-1.0 wt. % Cu, a commercially-available gallium oxide target and a palladium oxide target were set at three-divided positions which were located on a concentric circle having a radius of 160 mm from the center axis of a sputtering apparatus. Then, the inside of the apparatus was evacuated, and Ar gas was introduced therein until the pressure reached $5.0\times10^{-1}$ Pa. Subsequently, the thin film was formed on a substrate by the steps of: mounting the substrate on the center of a turntable; keeping the turntable rotate at 10 rpm; and applying sputtering electric powers of a direct current of 0.99 kW to the silver alloy target, a high-frequency current of 0.1 kW to the gallium oxide target and a high-frequency current of 0.03 kW to the palladium oxide target to sputter the targets for eight seconds. Thus produced thin film had a composition of Ag-1.0 wt. % Pd-1.0 wt. % Cu/0.1 wt. % $Ga_2O_3$-0.1 wt. % PdO. The composition corresponds to a sample No. 23 which will be described later. By employing the co-sputtering technique, the composition of the thin film can be adjusted by changing the type of a target used in combination with the silver alloy target. In the present embodiment as well, the thin films of the samples No. 20 to 22 and 24 to 43 were produced by the method.

(iii) Reactive Sputtering

After the two plates of a silver alloy target with a composition of Ag-0.8 wt. % Ga-1.0 wt. % Cu and a silver alloy target with a composition of Ag-1.0 wt. % Ga-1.0 wt. % Cu were set in a sputtering apparatus, the apparatus was evacuated, and Ar gas was introduced therein till the pressure reached $5.0 \times 10^{-1}$ Pa. Subsequently, nitrogen gas was introduced therein as a reactive gas. A partial pressure of the nitrogen gas was controlled into $2.0 \times 10^{-3}$ Pa. Subsequently, the thin film was formed on a substrate by the steps of: mounting the substrate on the center of a turntable; keeping the turntable rotating at 10 rpm; and applying sputtering electric powers of a direct current of 0.5 kW to the respective targets to sputter them for eight seconds. Thus produced thin film had a composition of Ag-0.8 wt. % Ga-1.0 wt. % Cu/0.1 wt. % GaN. The composition corresponds to a sample No. 48 which will be described later. By employing the reactive sputtering technique, the composition of the thin film can be adjusted by selecting an appropriate type of the targets, controlling the partial pressure of the reactant gas, and increasing or decreasing each sputtering electric power to each target when two or more targets are used. In the present embodiment as well, the thin films of the samples No. 44 to 47 and 49 to 117 were produced by the method.

C: Evaluation of Thin Film

A thin film was evaluated by evaluating characteristics of a DVD medium which was prepared by forming a thin film on a polycarbonate substrate in the above described way. The evaluation was conducted by the steps of: measuring a jitter value, a PI error, a PO failure and a reflectance of the DVD medium in an initial state after having been prepared with the use of an optical disc evaluation instrument (optical disc evaluation instrument ODU-1000 made by Pulstec Industrial Co., Ltd.); confirming whether they were within a range of DVD standards;

subsequently subjecting the DVD medium to an accelerating environmental test of exposing the DVD medium into an environment of a temperature of 80° C. and a relative humidity of 85% for 500 hours; and measuring the respective values of the DVD medium after having been subjected to the accelerating environmental test by using the evaluation instrument. The results are shown in Tables 3 to 6. The table also shows the result of a similar test on a DVD medium having a pure silver film formed thereon as a reflection film.

TABLE 3

| Sample No. | Sample composition (wt. %)*[1] | Method for producing thin film*[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 1 | Ag/2.5GaN | a | 14.8 | 969.5 | 0.0 | 5.1 | 7.6 | 18.3 | 51.2 | 50.8 |
| 2 | Ag/1.0Cu3N | a | 33.9 | 894.4 | 0.0 | 4.3 | 6.2 | 18.1 | 52.0 | 50.7 |
| 3 | Ag—5.0Cu/1.0GaN | b | 16.0 | 765.6 | 0.0 | 4.2 | 7.6 | 15.3 | 48.7 | 48.8 |
| 4 | Ag—5.0Cu/2.5GaN | b | 39.3 | 819.2 | 0.0 | 4.4 | 6.9 | 16.3 | 48.1 | 48.3 |
| 5 | Ag—10.0Pd/2.5GaN | b | 43.4 | 1211.3 | 0.0 | 6.7 | 6.4 | 22.3 | 45.8 | 45.2 |
| 6 | Ag—5.0Cu/1.0Ga2O3 | b | 11.9 | 557.6 | 0.0 | 3.1 | 6.8 | 12.3 | 49.0 | 48.2 |
| 7 | Ag—5.0Pd/2.5Ga2O3 | b | 36.7 | 1408.9 | 0.0 | 7.4 | 7.3 | 24.3 | 49.6 | 49.7 |
| 8 | Ag—10.0Cu/2.5Ga2O3 | b | 27.0 | 634.5 | 0.0 | 3.7 | 7.5 | 14.3 | 45.9 | 45.9 |
| 9 | Ag—3.5Ga/2.5Cu3N | b | 25.7 | 840.5 | 0.0 | 4.1 | 6.4 | 18.5 | 48.2 | 48.0 |
| 10 | Ag—10.0Ga/1.0Cu3N | b | 26.3 | 823.2 | 0.0 | 4.2 | 7.4 | 20.7 | 45.8 | 45.9 |
| 11 | Ag—5.0Pd/1.0Cu3N | b | 32.2 | 1033.9 | 0.0 | 4.9 | 6.2 | 19.8 | 48.3 | 47.6 |
| 12 | Ag—3.5Pd/2.5CuO | b | 17.6 | 999.6 | 0.0 | 5.1 | 6.3 | 20.0 | 49.7 | 49.4 |
| 13 | Ag—3.0Ga—0.5Cu/1.0Ga2O3 | c | 12.3 | 1418.3 | 0.0 | 7.3 | 7.1 | 25.3 | 49.5 | 47.6 |
| 14 | Ag—2.0Cu—1.5Pd/2.5Ga2O3 | c | 51.1 | 1057.8 | 0.0 | 5.9 | 7.6 | 20.3 | 49.1 | 48.7 |
| 15 | Ag/1.0GaP | c | 32.3 | 1258.0 | 0.0 | 6.8 | 6.4 | 21.9 | 50.7 | 50.7 |
| 16 | Ag/1.0GaS | c | 32.5 | 1036.0 | 0.0 | 5.6 | 6.4 | 17.6 | 49.8 | 48.2 |
| 17 | Ag/1.0GaSe | c | 20.5 | 1050.5 | 0.0 | 5.5 | 6.7 | 17.8 | 49.8 | 49.6 |
| 18 | Aq/1.0GaTe | c | 25.1 | 1215.4 | 0.0 | 5.9 | 6.3 | 18.6 | 48.5 | 47.5 |
| 19 | Ag/1.0Ga2Te3 | c | 46.0 | 1187.2 | 0.0 | 5.6 | 6.5 | 18.9 | 48.1 | 48.2 |
|  | Ag100.0 | — | 41.4 | 1664.0 | 0.0 | 8.0 | 7.6 | 27.0 | 56.8 | 51.7 |

*[1]A front part of "/" represents silver or a silver alloy of a matrix, and a rear part represents a compound phase.
*[2]Methods for producing thin films are described below.
a: internally chemically-combined type target was used
b: sintered type target was used
c: embedded type target was used

TABLE 4

| Sample No. | Sample composition (wt. %)*[1] | Method for producing thin film*[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 20 | Ag—2.5Ga—1.0Cu/0.5GaN | d | 37.7 | 1212.2 | 0.0 | 6.5 | 6.4 | 21.3 | 49.5 | 49.3 |
| 21 | Ag—3.0Ga—1.0Pd—1.0Cu/2.5Cu3N | d | 28.1 | 881.5 | 0.0 | 4.3 | 6.9 | 19.2 | 48.1 | 46.5 |
| 22 | Ag—3.0Ga—1.0Pd—1.0Cu/1.0CuO | d | 11.3 | 1128.4 | 0.0 | 5.2 | 7.2 | 20.7 | 48.7 | 48.6 |
| 23 | Ag—1.0Pd—1.0Cu/0.1Ga2O3—0.1PdO | d | 43.0 | 666.0 | 0.0 | 3.6 | 6.8 | 14.3 | 52.6 | 52.5 |
| 24 | Ag/2.5Cu2S | d | 45.3 | 1346.8 | 0.0 | 7.4 | 6.2 | 22.7 | 52.2 | 52.4 |
| 25 | Ag—1.0Cu/0.1Cu2S | d | 18.4 | 1346.8 | 0.0 | 7.4 | 7.5 | 23.8 | 53.2 | 53.3 |

TABLE 4-continued

| Sample No. | Sample composition (wt. %)*[1] | Method for producing thin film*[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 26 | Ag—1.0Ga/0.1Cu2S | d | 42.2 | 1313.5 | 0.0 | 7.1 | 7.2 | 22.3 | 53.3 | 53.0 |
| 27 | Ag—1.0cu—0.8Ga/0.1Cu2S | d | 12.1 | 1262.9 | 0.0 | 7.3 | 7.4 | 23.4 | 52.0 | 50.6 |
| 28 | Ag—1.0Pd/0.1Cu2S | d | 18.1 | 1310.4 | 0.0 | 7.2 | 6.7 | 23.8 | 53.6 | 51.9 |
| 29 | Ag—1.0Cu—1.0Pd/0.1Cu2S | d | 42.7 | 1199.3 | 0.0 | 6.7 | 6.2 | 21.1 | 51.7 | 50.8 |
| 30 | Ag—1.5Ga—2.0Cu/2.5PdSi | d | 14.7 | 760.0 | 0.0 | 3.8 | 6.6 | 14.9 | 49.9 | 49.9 |
| 31 | Ag—3.0Ga—0.5Pd/1.0PdSi | d | 18.2 | 1031.4 | 0.0 | 5.4 | 6.3 | 17.9 | 49.3 | 47.9 |
| 32 | Ag/2.5PdSi | d | 30.5 | 636.0 | 0.0 | 3.0 | 6.7 | 13.5 | 51.8 | 50.7 |
| 33 | Ag—3.5Pd/0.1PdSi | d | 41.6 | 820.0 | 0.0 | 4.1 | 6.5 | 14.9 | 51.1 | 49.7 |
| 34 | Ag—1.0Ga/0.1PdSi | d | 45.3 | 826.8 | 0.0 | 3.9 | 6.4 | 14.6 | 53.1 | 52.3 |
| 35 | Ag—1.0Cu—0.8Ga/0.1PdSi | d | 47.0 | 805.6 | 0.0 | 3.8 | 6.9 | 15.0 | 52.2 | 51.6 |
| 36 | Ag—1.0Pd/0.1PdSi | d | 23.0 | 812.0 | 0.0 | 4.0 | 7.6 | 15.7 | 53.3 | 53.5 |
| 37 | Ag—1.0Cu—1.0Pd/0.1PdSi | d | 43.4 | 830.4 | 0.0 | 3.2 | 6.8 | 13.9 | 52.3 | 52.3 |
| 38 | Ag/0.5Cu3P | d | 32.9 | 1160.0 | 0.0 | 5.8 | 7.1 | 20.9 | 49.2 | 49.0 |
| 39 | Ag/0.5Cu2S | d | 17.3 | 1240.0 | 0.0 | 6.2 | 7.0 | 19.9 | 50.7 | 50.3 |
| 40 | Ag/0.5Cu5Si | d | 38.5 | 1047.6 | 0.0 | 5.4 | 6.6 | 18.4 | 49.6 | 49.3 |
| 41 | Ag/0.5Cu2Se | d | 20.2 | 970.0 | 0.0 | 5.0 | 6.6 | 18.9 | 49.6 | 49.2 |
| 42 | Ag/0.5cu2Te | d | 21.2 | 1128.6 | 0.0 | 5.4 | 6.3 | 18.9 | 48.7 | 48.8 |
| 43 | Ag/0.5CuCl2 | d | 39.1 | 1067.0 | 0.0 | 5.5 | 7.2 | 19.0 | 49.0 | 48.9 |
|  | Ag100.0 | — | 41.4 | 1664.0 | 0.0 | 8.0 | 7.6 | 27.0 | 56.8 | 51.7 |

*[1]A front part of "/" represents silver or a silver alloy of a matrix, and a rear part represents a compound phase.
*[2]Methods for producing thin films are described below.
a: internally chemically-combined type target was used
b: sintered type target was used
c: embedded type target was used
d: co-sputtering
e: reactive sputtering

TABLE 5

| Sample No. | Sample composition (wt. %)*[1] | Method for producing thin film*[2] | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 44 | Ag/1.0GaN | e | 32.9 | 888.3 | 0.0 | 4.5 | 6.3 | 18.2 | 52.9 | 52.7 |
| 45 | Ag—0.8Ga/0.1GaN | e | 16.2 | 390.6 | 0.0 | 4.0 | 7.5 | 16.7 | 52.8 | 52.5 |
| 46 | Ag—1.0Ga/0.1GaN | e | 47.1 | 381.8 | 0.0 | 1.5 | 6.6 | 9.5 | 52.8 | 52.3 |
| 47 | Ag—1.0Sn—1.0Ga/0.5GaN | e | 48.5 | 642.8 | 0.0 | 3.5 | 6.8 | 14.7 | 52.8 | 51.9 |
| 48 | Ag—0.8Ga—1.0Cu/0.1GaN | e | 18.2 | 194.8 | 0.0 | 1.0 | 7.1 | 8.1 | 52.7 | 52.7 |
| 49 | Ag—1.0Ga—1.0Pd/0.5GaN | e | 28.3 | 640.9 | 0.0 | 3.0 | 7.5 | 13.9 | 52.5 | 51.3 |
| 50 | Ag—1.0Cu—1.0Pd/0.1GaN | e | 23.3 | 475.0 | 0.0 | 2.0 | 7.3 | 10.9 | 52.6 | 52.2 |
| 51 | Ag/1.0Ga2O3 | e | 15.8 | 918.5 | 0.0 | 5.0 | 7.5 | 19.5 | 53.4 | 52.7 |
| 52 | Ag—0.8Ga/0.1Ga2O3—0.8Ga | e | 21.3 | 430.8 | 0.0 | 4.5 | 6.8 | 17.9 | 52.4 | 52.3 |
| 53 | Ag—1.0Ga/0.1Ga2O3 | e | 14.8 | 461.2 | 0.0 | 2.0 | 7.2 | 11.0 | 53.1 | 51.9 |
| 54 | Ag—1.0Sn—1.0Ga/0.5Ga2O3 | e | 36.4 | 762.3 | 0.0 | 4.0 | 7.5 | 16.2 | 52.4 | 51.9 |
| 55 | Ag—0.8Ga—1.0Cu—0.1Ga2O3 | e | 45.2 | 270.3 | 0.0 | 1.5 | 6.4 | 9.6 | 52.2 | 52.2 |
| 56 | Ag—1.0Ga—1.0Pd/0.5Ga2O3 | e | 30.3 | 650.7 | 0.0 | 3.5 | 6.5 | 15.1 | 52.5 | 52.5 |
| 57 | Ag—1.0Cu—1.0Pd/0.1Ga2O3 | e | 43.7 | 467.0 | 0.0 | 2.5 | 6.2 | 12.5 | 52.3 | 51.8 |
| 58 | Ag—0.2Ga/0.001GaN | e | 32.9 | 678.9 | 0.0 | 3.6 | 6.2 | 13.6 | 54.3 | 54.0 |
| 59 | Ag—0.5Ga/0.001GaN | e | 25.1 | 635.1 | 0.0 | 2.8 | 7.3 | 12.0 | 54.2 | 53.0 |
| 60 | Ag—0.5Ga/0.01GaN | e | 30.0 | 603.7 | 0.0 | 3.4 | 6.9 | 13.2 | 54.4 | 54.4 |
| 61 | Ag—0.5Ga/0.05GaN | e | 40.4 | 572.4 | 0.0 | 2.6 | 7.5 | 11.2 | 54.2 | 53.6 |
| 62 | Ag—0.5Ga/0.1GaN | e | 40.8 | 564.9 | 0.0 | 4.5 | 6.2 | 17.0 | 53.9 | 53.6 |
| 63 | Ag—1.3Ga/0.1GaN | e | 31.9 | 365.4 | 0.0 | 3.2 | 7.0 | 13.0 | 52.3 | 52.2 |
| 64 | Ag—0.8Ga—1.0Cu/0.001GaN—0.002Cu3N | e | 23.2 | 409.8 | 0.0 | 3.8 | 6.9 | 14.6 | 52.9 | 52.8 |
| 65 | Ag—0.5Ga—1.0Cu/0.01GaN—0.02Cu3N | e | 38.2 | 433.9 | 0.0 | 2.4 | 7.5 | 11.1 | 50.2 | 49.6 |
| 66 | Ag—0.5Ga—1.0Cu/0.1GaN | e | 18.2 | 524.7 | 0.0 | 2.8 | 7.3 | 11.6 | 50.1 | 49.1 |
| 67 | Ag—0.6Ga—1.0Cu/0.2GaN | e | 15.3 | 437.2 | 0.0 | 2.3 | 7.6 | 10.6 | 51.5 | 50.3 |
| 68 | Ag—0.5Ga—1.0Cu/0.3GaN | e | 23.3 | 640.1 | 0.0 | 3.7 | 7.2 | 14.6 | 50.9 | 50.8 |
| 69 | Ag—0.8Ga—1.0Cu/0.1GaN—0.2Cu3N | e | 51.1 | 398.2 | 0.0 | 3.0 | 6.8 | 12.9 | 49.9 | 49.2 |
| 70 | Ag—0.5Ga—0.5Cu/0.1GaN—0.2Cu3N | e | 51.4 | 566.3 | 0.0 | 2.4 | 6.5 | 10.9 | 54.0 | 53.7 |
| 71 | Ag—0.4Ga—0.9Cu/0.1GaN | e | 18.6 | 636.2 | 0.0 | 3.3 | 7.0 | 13.2 | 53.3 | 53.4 |
| 72 | Ag—0.7Ga—1.2Cu/0.1GaN | e | 28.2 | 672.2 | 0.0 | 3.7 | 7.6 | 14.3 | 52.8 | 51.0 |
| 73 | Ag—0.8Ga—1.0Cu/0.001Ga2O3-0.002Cu2O | e | 23.4 | 454.7 | 0.0 | 5.9 | 6.3 | 20.1 | 54.4 | 54.5 |
| 74 | Ag—0.5Ga/0.001Ga2O3 | e | 12.0 | 1021.8 | 0.0 | 5.3 | 6.9 | 18.7 | 54.1 | 54.2 |

TABLE 5-continued

| Sample No. | Sample composition (wt. %)*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 75 | Ag—0.5Ga/0.01Ga2O3 | e | 21.5 | 981.7 | 0.0 | 5.1 | 7.3 | 18.0 | 54.2 | 53.6 |
| 76 | Ag—0.5Ga/0.1Ga2O3 | e | 30.1 | 892.0 | 0.0 | 5.0 | 7.2 | 18.3 | 53.6 | 53.0 |
| 77 | Ag—1.3Ga/0.1Ga2O3 | e | 42.8 | 825.7 | 0.0 | 4.5 | 6.7 | 17.2 | 52.6 | 52.1 |
| 78 | Ag—1.6Ga/0.2Ga2O3 | e | 24.6 | 1008.3 | 0.0 | 5.7 | 7.0 | 20.1 | 53.0 | 52.9 |
| 79 | Ag—0.8Ga—1.0Cu/0.01Ga2O3 | e | 50.5 | 479.5 | 0.0 | 5.5 | 6.6 | 19.9 | 52.0 | 51.3 |
| 80 | Ag—0.5Ga—0.5Cu/0.1Ga2O3 | e | 27.5 | 1009.1 | 0.0 | 5.6 | 7.3 | 18.8 | 54.1 | 54.2 |
| 81 | Ag—0.8Ga—1.0Cu/0.1G2O3-0.2Cu2O | e | 44.8 | 406.9 | 0.0 | 5.1 | 7.3 | 17.8 | 53.2 | 52.2 |
| | Ag100.0 | — | 41.4 | 1664.0 | 0.0 | 8.0 | 7.6 | 27.0 | 56.8 | 51.7 |

*1A front part of "/" represents silver or a silver alloy of a matrix, and a rear part represents a compound phase.
*2Methods for producing thin films are described below.
a: internally chemically-combined type target was used
b: sintered type target was used
c: embedded type target was used
d: co-sputtering
e: reactive sputtering

TABLE 6

| Sample No. | Sample composition (wt. %)*1 | Method for producing thin film*2 | PI error Initial stage | PI error After humidification | PO failure Initial stage | PO failure After humidification | Jitter (%) Initial stage | Jitter (%) After humidification | Reflectance (%) Initial stage | Reflectance (%) After humidification |
|---|---|---|---|---|---|---|---|---|---|---|
| 82 | Ag—0.6Ga—1.0Cu/0.1Ga2O3 | e | 22.6 | 633.0 | 0.0 | 5.4 | 6.2 | 18.3 | 50.5 | 49.7 |
| 83 | Ag—1.0Ga—1.0Cu/0.1Ga2O3 | e | 20.5 | 506.7 | 0.0 | 5.1 | 6.8 | 18.6 | 52.9 | 53.1 |
| 84 | Ag—0.4Ga—1.0Cu/0.2Ga2O3 | e | 20.6 | 812.6 | 0.0 | 4.4 | 6.9 | 15.8 | 53.1 | 53.1 |
| 85 | Ag—0.6Ga—1.0Cu/0.2Ga2O3 | e | 39.4 | 745.9 | 0.0 | 5.7 | 6.5 | 19.1 | 50.6 | 49.3 |
| 86 | Ag—0.8Ga—1.0Cu/0.2Ga2O3-0.4Cu2O | e | 22.1 | 651.4 | 0.0 | 4.5 | 6.8 | 16.1 | 49.4 | 49.5 |
| 87 | Ag—0.4Ga—1.0Cu/0.3Ga2O3 | e | 47.2 | 951.0 | 0.0 | 5.2 | 7.4 | 18.9 | 51.9 | 51.3 |
| 88 | Ag—0.8Ga—0.1Pd—1.0Cu/0.1GaN | e | 38.0 | 717.6 | 0.0 | 3.9 | 7.4 | 14.9 | 50.7 | 50.3 |
| 89 | Ag—0.8Ga—0.2Pd—1.0Cu/0.2GaN | e | 13.1 | 849.1 | 0.0 | 4.6 | 7.6 | 16.8 | 50.7 | 49.5 |
| 90 | Ag/2.5Cu3N | e | 41.4 | 1320.0 | 0.0 | 7.5 | 6.2 | 22.0 | 51.7 | 51.9 |
| 91 | Ag—1.0Cu/0.1Cu3N | e | 41.2 | 1161.6 | 0.0 | 6.6 | 6.5 | 20.5 | 53.4 | 52.8 |
| 92 | Ag—1.0Ga/0.1Cu3N | e | 39.5 | 679.0 | 0.0 | 3.5 | 7.1 | 15.7 | 52.6 | 52.6 |
| 93 | Ag—1.0Cu—0.8Ga/0.1Cu3N | e | 36.3 | 554.9 | 0.0 | 3.1 | 6.6 | 13.3 | 52.5 | 51.8 |
| 94 | Ag—1.0Pd/0.1Cu3N | e | 14.3 | 1047.6 | 0.0 | 5.4 | 6.9 | 19.4 | 53.4 | 52.5 |
| 95 | Ag—1.0Cu—1.0Pd/0.1Cu3N | e | 34.7 | 680.6 | 0.0 | 2.2 | 7.4 | 12.7 | 51.8 | 51.9 |
| 96 | Ag—1.0Ga—1.0Pd/0.5Cu3N | e | 46.3 | 1319.9 | 0.0 | 6.7 | 7.5 | 23.4 | 50.6 | 49.7 |
| 97 | Ag/2.5CuO | e | 32.3 | 1324.6 | 0.0 | 7.4 | 6.2 | 22.9 | 52.1 | 52.3 |
| 98 | Ag—1.0Cu/0.1CuO | e | 47.2 | 1401.4 | 0.0 | 7.7 | 7.4 | 26.6 | 53.3 | 52.5 |
| 99 | Ag—1.0Ga/0.1CuO | e | 43.3 | 1353.6 | 0.0 | 7.2 | 6.5 | 21.5 | 52.7 | 52.3 |
| 100 | Ag—1.0Cu—0.8Ga/0.1CuO | e | 30.1 | 1280.5 | 0.0 | 6.5 | 7.0 | 22.5 | 52.2 | 51.6 |
| 101 | Ag—1.0Pd/0.1CuO | e | 48.3 | 1262.9 | 0.0 | 7.3 | 7.3 | 25.4 | 53.2 | 53.1 |
| 102 | Ag—1.0Cu—1.0Pd/0.1CuO | e | 33.6 | 1337.0 | 0.0 | 7.0 | 6.1 | 22.7 | 52.3 | 51.6 |
| 103 | Ag—1.0Ga—1.0Pd/0.5cuO | e | 36.6 | 1337.6 | 0.0 | 6.4 | 6.4 | 19.4 | 50.0 | 49.6 |
| 104 | Ag/2.5PdO | e | 11.8 | 636.0 | 0.0 | 3.0 | 7.3 | 14.0 | 49.3 | 48.8 |
| 105 | Ag—3.5PdO/0.1PdO | e | 40.6 | 451.5 | 0.0 | 1.9 | 7.6 | 11.8 | 49.5 | 48.7 |
| 106 | Ag—1.0Ga/0.1PdO | e | 33.7 | 343.8 | 0.0 | 1.8 | 6.7 | 11.1 | 51.2 | 50.1 |
| 107 | Ag—1.0Cu—0.8Ga/0.1PdO | e | 21.6 | 355.3 | 0.0 | 1.7 | 6.6 | 10.2 | 50.2 | 50.4 |
| 108 | Ag—1.0Pd/0.1PdO | e | 33.3 | 477.5 | 0.0 | 2.5 | 7.3 | 13.1 | 51.5 | 51.5 |
| 109 | Ag—1.0Cu—1.0Pd/0.1PdO | e | 25.9 | 401.1 | 0.0 | 2.1 | 6.5 | 10.8 | 50.4 | 48.8 |
| 110 | Ag—0.8Ga—1.0Cu/0.01GaN—0.02Cu3N | e | 31.2 | 373.3 | 0.0 | 3.7 | 7.6 | 15.5 | 49.8 | 49.5 |
| 111 | Ag—0.8Ga—1.0Cu/0.1GaN—0.2Cu3N—0.01AgN | e | 39.6 | 349.3 | 0.0 | 3.4 | 6.7 | 15.0 | 51.9 | 50.4 |
| 112 | Ag—0.8Ga—1.0Cu/0.01Ga2O3-0.02Cu2O | e | 40.1 | 436.5 | 0.0 | 2.9 | 7.5 | 13.4 | 51.7 | 51.9 |
| 113 | Ag—0.8Ga—1.0Cu/0.1Ga2O3-0.2Cu2O—0.01Ag2O | e | 49.1 | 431.9 | 0.0 | 2.7 | 6.2 | 12.5 | 50.6 | 48.9 |
| 114 | Ag—1.0Pd—1.0Cu/0.01Cu3N | e | 45.7 | 610.7 | 0.0 | 3.1 | 7.3 | 15.0 | 51.7 | 51.0 |
| 115 | Ag—1.0Pd—1.0Cu/0.1Cu3N—0.01AgN | e | 14.7 | 585.2 | 0.0 | 2.8 | 6.5 | 12.9 | 51.1 | 50.6 |
| 116 | Ag—1.0Pd—1.0Cu/0.01PdO—0.02Cu2O | e | 48.8 | 424.0 | 0.0 | 2.0 | 6.6 | 10.6 | 52.2 | 51.3 |
| 117 | Ag—1.0Pd—1.0Cu/0.1PdO—0.2Cu2O—0.01AgO | e | 17.9 | 465.6 | 0.0 | 2.4 | 6.4 | 11.4 | 50.5 | 50.7 |
| | Ag100.0 | — | 41.4 | 1664.0 | 0.0 | 8.0 | 7.6 | 27.0 | 56.8 | 51.7 |

TABLE 6-continued

|  |  | Method for producing thin film*[2] | PI error | | PO failure | | Jitter (%) | | Reflectance (%) | |
| --- | --- | --- | --- | --- | --- | --- | --- | --- | --- | --- |
| Sample No. | Sample composition (wt. %)*[1] | | Initial stage | After humidification | Initial stage | After humidification | Initial stage | After humidification | Initial stage | After humidification |

*[1] A front part of "/" represents silver or a silver alloy of a matrix, and a rear part represents a compound phase.
*[2] Methods for producing thin films are described below.
a: internally chemically-combined type target was used
b: sintered type target was used
c: embedded type target was used
d: co-sputtering
e: reactive sputtering As is clear from these Tables, it was confirmed that a recording medium provided with a reflection film having a compound phase therein according to the present invention showed less occurrences of a PI error and a PO failure and further a lower decreasing rate of a reflectance than a DVD medium provided with a reflection film formed from pure silver. For information, the DVD medium provided with the reflection film formed from pure silver was not recognized by a recording device after a humidification test, and became unusable.

INDUSTRIAL APPLICABILITY

As described above, a thin film according to the present invention makes the reflectance little lowered even after a long period of use, and can prolong the life of various devices which use the thin film as a reflection film, such as an optical recording medium and a display. The reflection film according to the present invention has also reflectance-keeping characteristics which are little affected by a wavelength of incident light. In this regard, the wavelength of light for a light source for recording is being shortened such as in the development of an HD-DVD using a blue laser beam, in a field of an optical recording medium. The present invention can cope with such a technology. The thin film according to the present invention provides merits of reducing the number of errors and extending the life, when applied to the optical recording medium, for instance.

In the present invention, a reflection film has only to have a function of reflecting light, and includes a film having optical transparency. Accordingly, the reflection film according to the present invention can be also applied to a semi-reflective/semi-transparent film used in an optical recording medium.

The invention claimed is:

1. A thin film for a reflection film or a semi-transparent reflection film, having a compound phase comprising at least one selected from the group consisting of nitride, oxide, complex oxide, nitroxide, carbide, sulfide, chloride, silicide, fluoride, boride, hydride, phosphide, selenide and telluride of gallium, palladium or copper, dispersed in a matrix formed of a silver alloy formed from silver and at least any one of gallium, palladium and copper.

2. The thin film for a reflection film or a semi-transparent reflection film as defined in claim 1, wherein at least one compound selected from the group consisting of nitride, oxide, complex oxide, nitroxide, carbide, sulfide, chloride, silicide, fluoride, boride, hydride, phosphide, selenide and telluride of silver is further dispersed in the matrix as a compound phase.

3. The thin film as defined in claim 1 wherein the compound phase has a content of 0.001 to 2.5 wt. %.

4. The thin film as defined in claim 1 wherein the compound phase has a content of 0.001 to 1.0 wt. %.

5. The thin film as defined in claim 1 wherein the compound phase has a content of 0.001 to 0.5 wt. %.

6. The thin film for a reflection film or a semi-transparent reflection film as defined in claim 1, wherein the gallium, palladium and/or copper to be alloyed with silver have a concentration of 0.01 to 10 wt. %.

7. The thin film for a reflection film or a semi-transparent reflection film as defined in claim 1, wherein the gallium, palladium and/or copper to be alloyed with silver have a concentration of 0.01 to 5 wt. %.

8. The thin film for a reflection film or a semi-transparent reflection film as defined in claim 1, wherein the gallium, palladium and copper to be alloyed with silver have a concentration of 0.01 to 3.5 wt. %.

9. A sputtering target having a compound phase comprising at least one selected from the group consisting of nitride, oxide, complex oxide, nitroxide, carbide, sulfide, chloride, silicide, fluoride, boride, hydride, phosphide, selenide and telluride of gallium, palladium or copper, dispersed in a matrix formed of a silver alloy formed from silver and at least any one of gallium, palladium and copper.

10. The sputtering target as defined in claim 9, wherein the compound phase includes at least one compound selected from the group consisting of nitride, oxide, complex oxide, nitroxide, carbide, sulfide, chloride, silicide, fluoride, boride, hydride, phosphide, selenide and telluride of silver.

11. The sputtering target as defined in claim 9 wherein the compound phase has a content of 0.001 to 2.5 wt. %.

12. The sputtering target as defined in claim 9 wherein the compound phase has a content of 0.001 to 1.0 wt. %.

13. The sputtering target as defined in claim 9 wherein the compound phase has a content of 0.001 to 0.5 wt. %.

14. The sputtering target as defined in claim 9, wherein the gallium, palladium and/or copper to be alloyed with silver have a concentration of 0.01 to 10 wt. %.

15. The sputtering target as defined in claim 9, wherein the gallium, palladium and copper to be alloyed with silver have a concentration of 0.01 to 5 wt. %.

16. The sputtering target as defined in claim 9, wherein the gallium, palladium and copper to be alloyed with silver have a concentration of 0.01 to 3.5 wt. %.

17. An optical recording medium comprising the thin film, which film being defined in claim 1 as a reflection film or a semi-transparent reflection film.

18. The thin film as defined in claim 2 wherein the compound phase has a content of 0.001 to 2.5 wt. %.

* * * * *